United States Patent [19]
Porter, III

[11] 3,990,020
[45] Nov. 2, 1976

[54] DC LINEAR POWER AMPLIFIER

[75] Inventor: Edwin C. Porter, III, Culver City, Calif.

[73] Assignee: Hughes Aircraft Company, Culver City, Calif.

[22] Filed: June 26, 1975

[21] Appl. No.: 590,666

[52] U.S. Cl. .......................... 330/207 P; 318/566; 318/681; 330/15; 330/146
[51] Int. Cl.² ........................................ H03F 21/00
[58] Field of Search ............... 330/15, 22, 40, 146, 330/207 P; 318/566, 628, 635, 678, 679, 681

[56] References Cited
UNITED STATES PATENTS

| | | | |
|---|---|---|---|
| 3,212,019 | 10/1965 | Schwartz | 330/15 X |
| 3,806,787 | 4/1974 | Erlen | 318/678 X |

OTHER PUBLICATIONS

Buhler, "Power Amplifier Providing Low-Power Dissipation in a Variable Speed Reel-to-Reel Tape Transport", *IBM Technical Disclosure Bulletin*, vol. 16, No. 8, Jan. 1974, pp. 2621–2623.

*Primary Examiner*—James B. Mullins
*Attorney, Agent, or Firm*—Rafael A. Cardenas; William H. MacAllister

[57] ABSTRACT

A DC linear power amplifier is disclosed having a first amplifier referenced to +14VDC, for receiving a control signal. The first amplifier in turn controls a first power stage connected to a load through a first sensing resistor. The first resistor provides a differential voltage to a second amplifier forming a current control loop with the first amplifier. A third amplifier controls a second power stage connected to the load through a second sensing resistor, so that the first and second power stages each dissipate equal power. The resistors each provide differential signals to a comparator which provides a first output signal if the current through each resistor is the same. If the differential signals are different, resulting from the load shorting to ground, the comparator provides a second output signal which turns the entire power amplifier essentially off. The entire power amplifier returns to normal when the short is eliminated.

6 Claims, 9 Drawing Figures

DC LINEAR POWER AMPLIFIER

FIELD OF THE INVENTION

This invention relates generally to amplifiers and in particular, to a DC linear amplifier for use in driving a DC servo system and providing short circuit current protection to the servo system by folding back the current.

DESCRIPTION OF THE PRIOR ART

Servo amplifiers are well known in the prior art and are commercially available from several manufacturers. Generally, servo amplifiers are used to power DC torque motors which drive radar antennas or the control surfaces of a missile. One of the primary failure modes of DC torque motors is the shorting of the windings in the motor to the motor's case, which is generally at ground potential. The servo amplifier, as a result of the shorted torque motor winding, provides a large current flow to the torque motor, which in turn causes the amplifier itself to fail.

Most commercially available DC servo amplifiers also require positive and negative DC power supplies for their operation.

SUMMARY OF THE INVENTION

Accordingly, it is the object of the present invention to provide a reliable, economical and small power amplifier.

It is another object of the present invention to provide equal power sharing by utilizing amplifiers on either side of a load and shifting the reference level from ground potential.

It is still another object of the present invention to utilize voltage sensing for controlling output current.

It is an object of the present invention to provide an amplifier capable of limiting or folding back current flow when the output is connected to ground potential.

It is an object of the present invention to provide a power amplifier utilizing only one power supply for supplying current bidirectionally through a load.

It is still another object of the present invention to provide current sensing of the current flowing in the load.

It is yet another object of the present invention to provide isolation between power supply return and signal return.

In accordance with the foregoing objects, a power amplifier includes a first amplifier coupled to one terminal of a load through first sensing means which provide a first differential signal. The first amplifier shifts the reference potential of the load and provides current thereto. A second amplifier is coupled to the first sensing means and provides feedback to the first amplifier. A third amplifier is coupled to a second terminal of the load through second sensing means which provide a second differential signal. A comparator circuit receives first and second differential signals and provides output signals to first and third amplifiers. The comparator provides a first output signal in response to like first and second differential signals and a second output signal in response to different first and second differential signals.

DETAILED DESCRIPTION OF THE DRAWINGS

Figure 1:
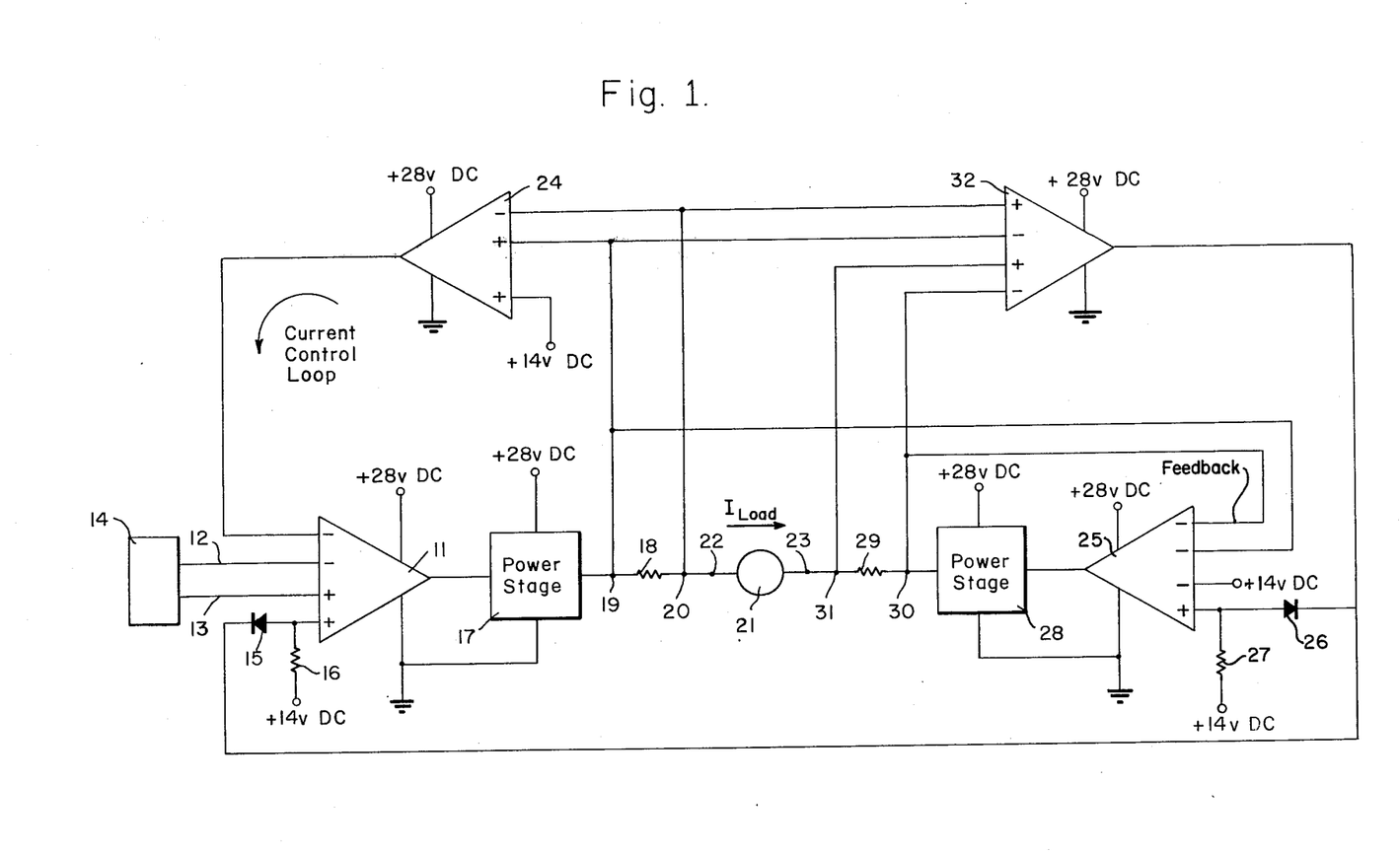
FIG. 1 is a schematic block diagram illustrating an embodiment of the invention.

Referring more specifically to FIG. 1, a power amplifier according to the invention may be seen to include a high gain amplifier 11, having a typical open loop gain of 100db. Positive and negative input electrodes of the amplifier 11 are connected to input terminals 12 and 13, respectively, for receiving input signals from a source of control signals 14. The negative input electrode of the amplifier 11 is connected to current control amplifier 22. The anode of a diode 15 and the first electrode of a bias resistor 16 are connected to the positive electrode of the amplifier 11. The cathode of the diode 15 is connected to the output terminal of a comparator circuit 32. The second electrode of the resistor 16 is coupled to a reference voltage such as +14VDC.

The amplifier 11 provides a dual function in the circuit of the present invention. Firstly, the amplifier 11 sets the quiescent or reference voltage of the load 21. As a result of the reference voltage of +14VDC applied to the positive input terminal, the amplifier 11 provides a nominal +14VDC output voltage which thereby sets the reference level voltage of the load 21. Secondly, the amplifier 11 controls the current flow through a first power stage 17 in response to command signals applied to terminals 12 and 13. Terminal 13 is referenced to ground potential, although control signals may be applied to either terminal 12 or 13 with the other terminal being referenced to ground potential. Input signals to the amplifier 11 may be differential voltage signals also. A more detailed description of the amplifier 11 is found below.

The output terminal of the amplifier 11 is connected to the input terminal of a first power stage 17. The power stage 17 is in turn coupled to a terminal 19 of a sensing device, such as a 10 watt precision resistor 18 having 0.05 ohms resistance, for example. A terminal 20 of the resistor 18 is connected directly to a first input terminal 22 of a load 21 for providing sensing of the current flowing in the load 21. The power stage provides current to the load 21 in response to the voltage signal from amplifier 11. As will be seen more clearly in the discussion below, the first power stage 17 dissipates power equal to the power dissipated by the power stage 28. Thus, the first and second power stages, 17 and 28, respectively, provide a power sharing function.

Terminals 19 and 20 of the resistor 18 are connected to the positive and negative input terminals, respectively, of a X10-differential amplifier 24, for example. The reference voltage is also connected to the positive input terminal of the amplifier 24. The output terminal of the amplifier 24 is connected to a negative input terminal of the amplifier 11. The +14VDC input signal at the positive input terminal of the amplifier 24 results in a nominal output voltage of +14VDC. The +14DC output of the amplifier 24 applied at the negative input terminal of the amplifier 11 maintains the amplifier 11 output at +14VDC in the quiescent state. When the load 21 draws current, however, a differential voltage is developed across the sensing resistor 18 and that differential voltage is amplified by the amplifier 24. The amplifier 24 in turn provides a correspondingly increased or decreased output voltage, depending upon the direction of current flow through the load 21 and the resistor 18. Thus, the amplifier 24 provides a voltage proportional to current flow through the resistor 18 in the response to the differential voltage developed by that resistor. The amplifier 24 provides feedback to amplifier 11 in turn controlling the current flow through the load 21.

An inverter 25 has three negative and one positive input terminals. One of the negative input terminals is connected to terminal 19. The second negative terminal is connected to terminal 30. The reference voltage is connected to the positive input terminal through a resistor 27. The reference voltage is also applied to the negative input terminal. The output terminal of the comparator 32 is coupled to the positive input terminal of the amplifier 21 through a diode 26. The anode is connected to the positive terminal while the cathode is connected to the comparator 32.

The reference voltage applied at the input terminals of the inverter 25 sets the output voltage at +14VDC nominally. Terminal 30 is connected to the second negative input terminal of the amplifier 25 and provides negative feedback for controlling the output of the amplifier 25. A positive voltage greater than +14VDC applied to the first negative input terminal results in an output voltage of less than +14VDC. Thus, if +19VDC is applied at the negative input terminals, the output and feedback signals of the inverter will be +9VDC.

The input terminal of a power stage 28 is connected to the output terminal of the inverter 25. The output terminal of the power stage 28 is connected to terminal 30 of a second sensing device such as a 10 watt, 0.05 ohm resistor 29. The second terminal 31 of the resistor 29 is connected to the second output terminal 23. The terminal 23 is in turn connected to the load 21.

The power stage 28 dissipates the same amount of power as the power stage 17, since the same amount of current flows in both networks and each stage operates equally above and below the reference voltage.

A comparator 32 is depicted with two positive and two negative input terminals. The first positive input terminal is connected to terminal 20; the second positive input terminal is connected to terminal 31. The first negative terminal is connected to terminal 19; the second negative input terminal is connected to terminal 30. The output terminal of the comparator 32 is connected to the cathode electrodes of the diodes 15 and 26.

The comparator 32 is biased so that the voltage at the output terminal is under normal operation +27VDC nominally. The output voltage is maintained at +27VDC so long as the differential voltages applied to the input terminals are the same. However, if different differential voltages are applied as a result of a short to ground in the load, the output signal from the comparator 32 is close to ground potential. The ground potential applied in turn to the amplifier 11 and the inverter 25 results in the current flow through the load being reduced or folded back to a relatively small value.

Figure 2:
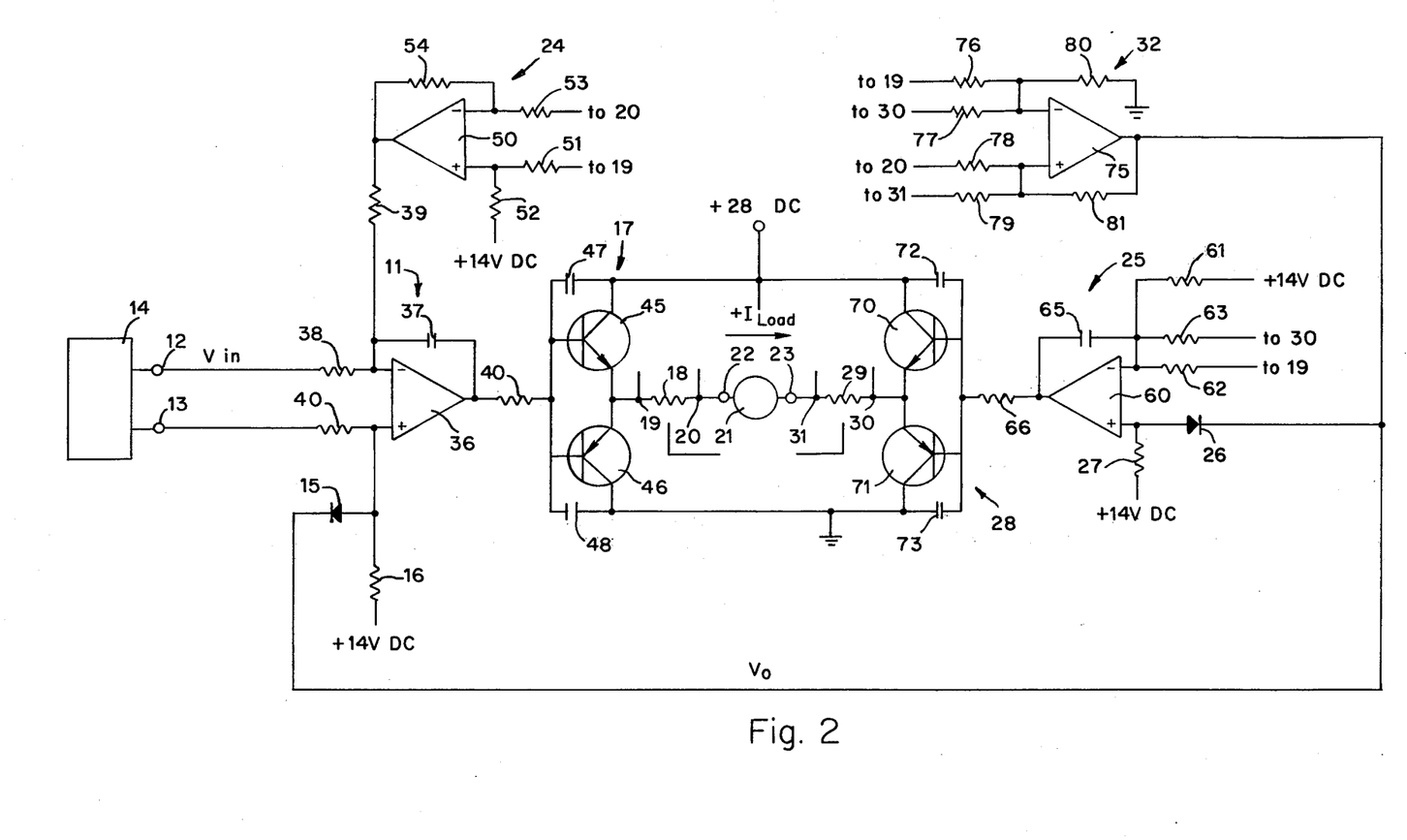
FIG. 2 is a schematic circuit diagram illustrating the invention according to FIG. 1 in greater detail.

Referring more specifically to FIG. 2, a more detailed schematic of the invention is now described. The high gain amplifier 11 includes an operational amplifier 36 having positive and negative input terminals and one output terminal, such as a one section of a National Semiconductor LM124 quad operational amplifier. A capacitor 37 is connected between the negative input terminal and the output terminal. A resistor 38 is connected between the negative input terminal of the amplifier and the input terminal 12. A resistor 39 is connected between the output terminal of the amplifier 24 and the negative input terminal of the amplifier 36. A resistor 40 is connected between the input terminal 13 and the positive input terminal of the amplifier 36. The anode electrode of the diode 15 and the resistor 16 are connected to the positive input terminal also. The cathode electrode of the diode is connected to the lead identified as $V_o$. The resistor 16 is also connected to +14VDC.

The output terminal of the amplifier 36 is connected to the input terminal of the power stage 17 by a resistor 40. The power stage 17 includes first and second current amplifiers such as power transistors 45 and 46 emitter coupled together. The bases of the transistors 45 and 46 are connected together and to the resistor 40. Decoupling capacitors 47 and 48 are connected between the emitters and bases of the transistors 51 and 52, respectively. The collector of the transistor 45 is connected to the power supply voltage such as +28VDC, for example. The collector of transistor 46 is connected to +28 volts return. The junction of the emitters of transistors 45 and 46 is connected to the terminal 19 of the sensing resistor 18. The resistor terminal 20 is connected to the output terminal 22. Transistor 45 may be an NPN darlington transistor such as 2N6284 and transistor 46 may be a PNP darlington transistor such as 2N6287.

The differential amplifier 24 includes an operational amplifier 50 having a positive input terminal, a negative input terminal and an output terminal similar to the operational amplifier 36. A resistor 51 connects the positive input terminal of the amplifier 50 with the terminal 19. A resistor 52 connects the positive input terminal of the amplifier 24 with the reference voltage. A resistor 53 is connected between the negative input terminal of the amplifier 50 and terminal 20. A feedback resistor 54 connects the negative input terminal and the output terminal of the amplifier 50. The output of the amplifier 50 is connected to the negative input terminal of the amplifier 36 through the resistor 39, thus completing the current control loop.

The inverting amplifier 25 includes an operational amplifier 60 having a positive input terminal, a negative input terminal and an output terminal similar to the operational amplifier 36. A resistor 61 connects the negative input terminal of the amplifier 60 and +14VDC. A resistor 62 is connected between the negative input terminal of the amplifier 60 and terminal 19. A resistor 63 connects the negative input terminal and terminal 30. A feedback capacitor 65 couples the negative input terminal and the output terminal of the amplifier 60. The capacitor 65 causes the amplifier to function as a current integrator. A coupling resistor 68 connects the output terminal of the amplifier 60 with the input terminal of the second power stage 28.

The anode of a diode 26 is connected to the positive input terminal of the amplifier 60 and the cathode is connected to the output terminal of the comparator 32. During the normal operation of the invention, the diode 26 is reverse biased by the +28VDC applied to the cathode and no current is conducted thereby. Whenever there is a short circuit in the load 21, the diode 62 is forward biased and the amplifier 60 becomes referenced to ground.

The power stage 28 includes first and second darlington transistors 70 and 71 that are emitter coupled together. The bases of the transistors 70 and 71 are also coupled together and to the resistor 66. The capacitors 72 and 73 are connected between the collector and base of transistors 70 and 71, respectively. The emitters of the transistors 70 and 71 are connected to the terminal 30 of the sensing resistor 29. The terminal 31 of the resistor 29 is connected to the output terminal 23 for the load 21.

The comparator 32 includes an operational amplifier 75, similar to the operational amplifier 36, having a positive input terminal, a negative input terminal, and an output terminal. The negative input terminal is connected to terminal 19 by a resistor 76. A resistor 77 connects the negative input terminal to terminal 30. A bias resistor 80 is connected between the negative input terminal and ground potential. The positive input terminal of the amplifier 75 is connected to terminal 20 by a resistor 78. A resistor 79 connects the positive input terminal with the terminal 31. A feedback resistor 81 connects the positive input terminal and the output terminal. The output terminal is connected to the cathode electrode of the diodes 15 and 26.

The amplifiers 36, 50, 60 and 75 may be a quad operational amplifier such as National Semiconductor Model LM124, for example.

The operation of the invention according to FIG. 2 is now described with reference to that figure and with respect to FIGS. 3, 4, 5, 6, 7 and 8.

The input terminals 12 and 13, are connected to the signal source 14 and to ground potential, respectively. The negative input terminal of the amplifier 36 is generally referred to as the inverting input terminal and so is terminal 12. Terminal 12 is so named because a positive signal applied thereto, with terminal 13 at ground potential, results in a negative output signal from the amplifier 36 and vice versa. Terminal 13, since it is coupled to the positive input terminal of the amplifier 36, is normally referred to as the noninverting input terminal. Terminal 13 is so named because an input signal of a given polarity applied thereto with terminal 12 at ground potential, results in an output signal from the amplifier 36 having the same polarity.

The reference voltage, +14VDC, applied to the resistors 16, 27 and 52, establishes the reference output voltages of the operational amplifiers 36, 50 and 60 at +14VDC. The reference voltage of the load 21 is thus established by level shifting the reference potential of the entire amplifier from ground to +14VDC.

Figure 3:
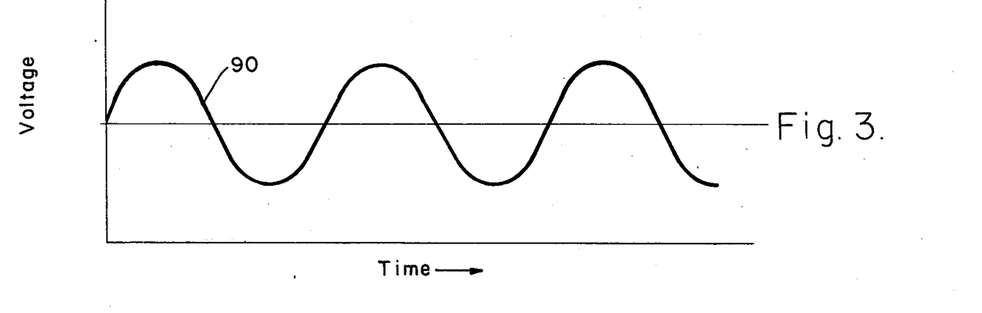
FIGS. 3–5 are illustrations of voltage waveforms developed in the circuit of FIGS. 1 and 2 during normal operation.

A positive voltage control signal, $V_{in}$, applied to terminal 12, such as the positive cycle of the sine wave 90 in FIG. 3, results in a negative output signal with respect to +14VDC at the amplifier 36. The amplifier 36 in turn causes transistor 46 in power stage 17 to conduct current from the load 21 to ground, while the transistor 45 is at cutoff. The positive input signal also results in transistor 70 in the power stage 28 being placed in conduction mode while the transistor 71 is at cut-off.

As the voltage control signal applied to terminal 12 becomes negative, the amplifier 36 causes transistor 45 to conduct current into the load 21 and the transistor 46 is at cutoff. The negative input signal causes the transistor 71 to conduct current into the load and the transistor 70 is at cut-off. Thus an input voltage signal applied to terminal 12 is converted to a proportional current through the load 21.

Figure 4:
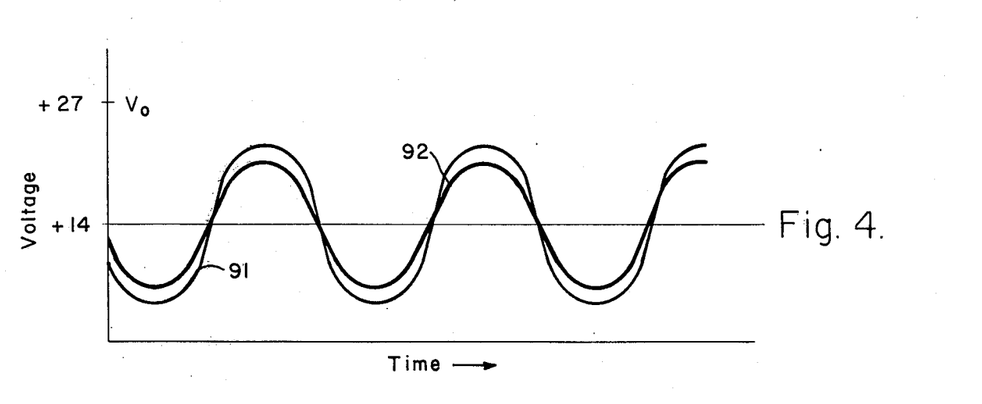
Figure 5:
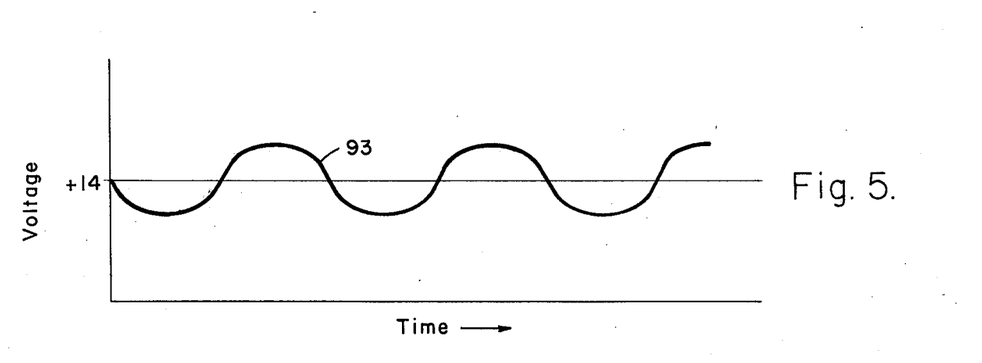

The current flowing through the sensing resistor 18 causes a differential voltage to be developed thereacross and that voltage is applied to the amplifier 50. FIG. 4 illustrates the voltage waveforms 91 and 92 of the terminals 19 and 20. Waveform 91 depicts the voltage at terminal 19, while waveform 92 depicts the voltage at terminal 20. It is noted that both waveforms are referenced at +14VDC. The difference voltages of the waveforms 91 and 92 are sensed and amplified by the amplifier 50, which provides a corresponding output that is summed with the input signal from terminal 12 via resistors 38 and 39. The waveform of the output voltage, proportional to load current, from the amplifier 50 is illustrated in FIG. 5.

The current control loop equations are as follows:

$$V_{50} = - \frac{R_{39}}{R_{38}} V_{in}$$

where $V_{50}$ is the output voltage of amplifier 50 referenced at +14VDC AND $R_{39}$ represents the resistance of resistor 39.

$$V_{50} = I_{load} \frac{R_{18} R_{54}}{R_{53}}$$

combining, we get $$I_{load} = - \frac{R_{53} R_{39}}{R_{18} R_{54} R_{38}} V_{in}$$

The amplifier 36 acts as a summing input for the control signals from control source 14, the +14VDC reference voltage used for level shifting, and the negative feedback signal from amplifier 50. The amplifier 36 will command current through the load 21 so as to make the input signal to the amplifier's inverting terminal equal to the voltage at the non-inverting terminal.

Level shifting from ground to +14VDC is accomplished by making resistor 16 equal in value to resistor 39 and resistor 38 equal in value to resistor 40. This resistance symmetry sets both negative and positive input terminals of amplifier 36 equal in voltage when both input terminals 12 and 13 of source 14 are at +0VDC and the output of amplifier 50 is equal to the +14VDC reference voltage applied to resistor 16. Since a +14VDC output of amplifier 50 corresponds to zero load current the current control loop is at a stable null.

Any signal applied to terminal 21 results in a voltage difference between the negative and positive input terminals of amplifier 36. Since amplifier 36 has a gain of 100db, for example, the voltage difference is greatly amplified causing load current to flow. The load current in turn, causes the output voltage of the amplifier 50 to drive until the voltage at the inverting input of amplifier 36 becomes equal to the voltage at the non-inverting terminal of that amplifier.

The amplifier 60 provides an output voltage of +14VDC as a result of the reference voltage applied to the resistor 27. The voltage applied to input resistor 62 by terminal 19 causes the output voltage of the amplifier 60 to vary accordingly, i.e. inversely to the input signal. For example, if a voltage which is negative with respect to +14VDC is applied to the resistor 62, the output voltage of the amplifier 60 will be at some value greater than +14VDC. If the voltage is positive with respect to +14VDC, the output voltage of the amplifier 60 will be less than +14VDC. Feedback is provided by terminal 30 to the amplifier 60. The voltage at terminal 30 varies inversely to the voltage at terminal 19 with respect to +14VDC, i.e., half the supply voltage as described by the equation $$V_{30} = -V_{19} \text{ (Referenced at +14VDC)} = -V_{19} + 14\text{VDC}$$

The power stage 28 is controlled by amplifier 60 for providing current drive to or receiving current from the load 21. A voltage which is negative with respect to +14VDC applied by the amplifier 60 causes transistor 71 to conduct current from the load 21 while transistor 70 is at cut-off. A voltage which is positive with respect to +14VDC applied by the amplifier 60 causes transistor 70 to conduct current into the load 21 while transistor 71 is at cut-off. Thus, in response to a given positive input signal to terminal 12, transistors 70 and 46 conduct current into and out of the load 21, respectively. And, a negative input signal to the input terminal 12 results in transistors 45 and 71 conducting current.

The power stage 17 and 28 operate so that each transistor, such as transistor 45, in a transistor pair, such as transistors 45 and 71, have the same voltage thereacross. Since each transistor in the transistor pair conducts the same current, equal power is dissipated by each transistor.

The operation of the control loop containing the comparator circuit 32 is now discussed with reference to FIG. 2 and 6–8. The non-inverting input terminal of the amplifier 75 is initially biased at +14VDC by the voltage applied by the terminals 20 and 31. The inverting input terminal is biased slightly below +14VDC by the resistor 80. As a consequence, the amplifier 75 drives in the positive direction toward saturation which is typically +27VDC. The positive feedback through resistor 81 further accentuates the drive toward saturation. The +27 volts output from the amplifier 75 is applied to the cathode electrodes of the diodes 15 and 26, which reverse-biases those diodes. Under normal operating conditions, the voltages applied at the non-inverting input terminal of the amplifier 75 is slightly more positive that the input voltage at the inverting terminal such that the output voltage of the amplifier 75 remains at +27 volts.

Figure 6:
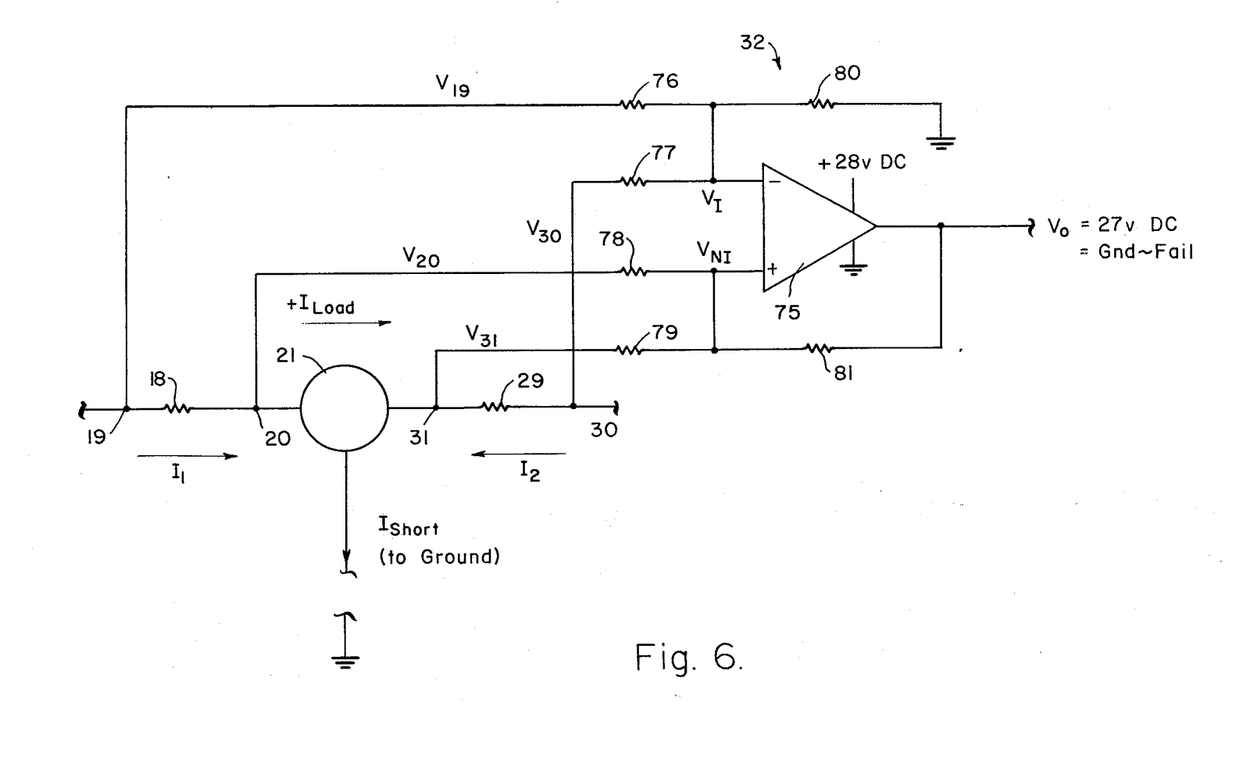
FIG. 6 is a more detailed schematic circuit diagram of a portion of the invention according to FIG. 2.
Figure 7:
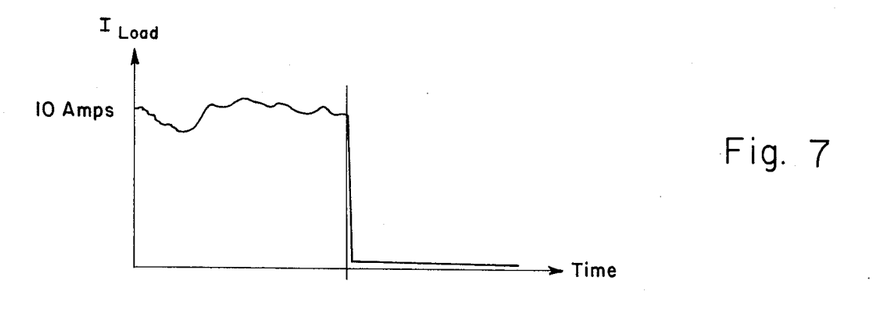
FIGS. 7–9 are illustrations of waveforms developed in the circuit of FIGS. 1 and 2 during failure mode.
Figure 8:
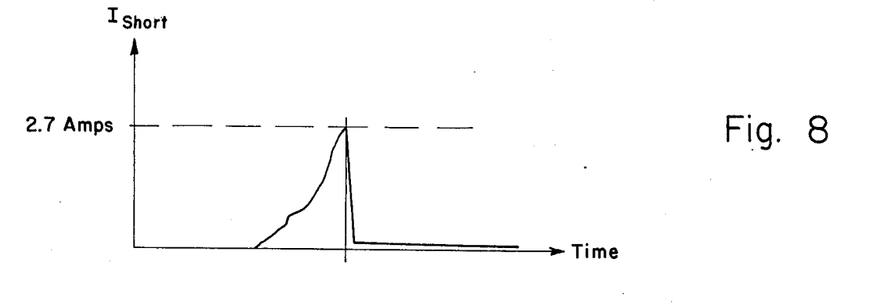
Figure 9:
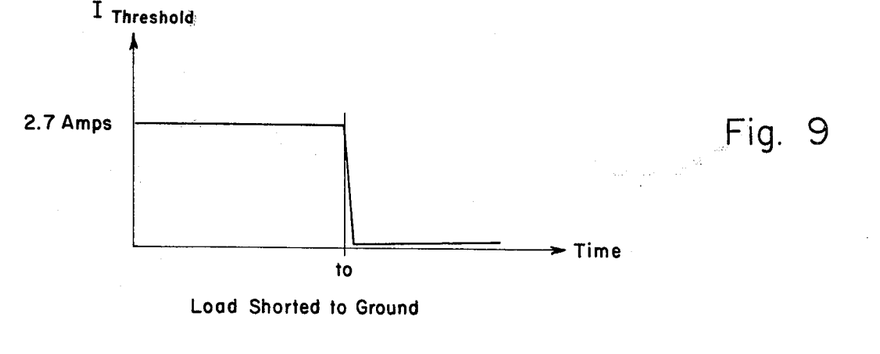

Referring more specifically to FIG. 6, the comparator circuit 32 is described in the case when there is a failure mode such as a short to ground in the load 21. One of the sensing resistors 18 or 29 conducts more current than the other because some current, $I_{short}$, is being conducted to ground. If the current $I_{short}$ exceeds a predetermined threshold level $I_{th}$, such as 2.7 amperes for example, the differential voltages applied by the sensing resistors 18 and 29 to the amplifier 75, cause the output of that amplifier to drop to nearly ground potential as illustrated in FIG. 7. The diodes 16 and 27 become forward biased causing transistors the amplifiers 36 and 60 to be referenced at ground potential instead of +14 volts. The +14VDC applied by the amplifier 50 to the inverting amplifier 36 causes the amplifier 36 output to drive toward ground potential, thereby turning transistor 45 off. The +14VDC applied to resistor 61 drives the output signal of amplifier 60 toward ground potential, also thereby turning transistor 70 off. The load current $I_{load}$ and the short circuit current $I_{short}$ are consequently reduced as seen in FIGS. 8 and 9 respectively. Prior to the short circuit current $I_{short}$ being reduced, the threshold level of the comparator is shifted essentially to zero as illustrated in FIG. 10. Thus the threshold level is maintained at approximately 0.1ma. It is pointed out that the threshold $I_{th}$ of the comparator is proportional to the differential voltage signals from the sensing resistors 18 and 29.

Given:
a. $R_1 = R_{76} = R_{77} = R_{78} = R_{79}$
b. $R_2 = R_{80} = R_{81}$
c. $R_{cs} = R_{18} = R_{29}$
d. $I_{load} = I_1 = I_2$, during normal operation.
e. $I_{short} = I_1 + I_2$, during failure mode when there is a short to ground in the load.
f. $I_{threshold}$ when the comparator changes state.

Then:

$$I_{short} = \frac{V_{19} - V_{20} + V_{30} - V_{31}}{R_{cs}} \qquad 1)$$

$$V_I = \frac{R_2}{2R_2 + R_1}(V_{19} + V_{30}) \qquad 2)$$

$$V_N = \frac{R_2}{2R_2 + R_1}(V_{20} + V_{31}) + \frac{R_1 V_0}{2R_2 + R_1} \qquad 3)$$

The comparator will change state, i.e. $V_o$ changes from +27VDC to 0VDC when $V_I \geq V_N$. Solving for $I_{th} = I_{short}$ when $V_I = V_N$.

$$I_{threshold} = \frac{R_1 V_o}{R_2 R_{cs}} \qquad 4)$$

If $R_1 = 5K\Omega$; $R_2 = 1M\Omega$ and $R_{cs} = 0.5\Omega$ $$I_{threshold} = 2.7 \text{ amperes} \qquad 5)$$

Thus it may be seen that as the short circuit current exceeds a threshold level, the comparator 75 limits the current by changing state and maintaining the second state until the short is removed.

It should be apparent from the foregoing that the present invention provides a power amplifier having current limiting or foldback protection whenever the load is shorted to ground potential. The present invention provides for direct current sensing of the current flowing into and out of a load. Thus, if the current flowing into a load in a given direction is greater than the current flowing out of the load, the load current is consequently reduced. In addition the present invention provides for equal power sharing by power stages on either side of the load.

Although the present invention has been shown and described with reference to particular embodiments, never-the-less, various changes and modifications obvious to one skilled in the art to which the invention pertains are deemed to be within the purview of the invention.

What is claimed is:

1. An amplifier having current foldback protection, whenever the current flowing into a load is different from the current flowing out of said load comprising:
   means for providing power to a load;
   first current sensing means coupling said power means to said load for sensing current flowing to said load and for providing a first sensing signal in response to said current;

second current sensing means coupling said power means to said load for sensing current flowing from said load and for providing a second sensing signal in response to said current;

comparator means responsive to said first and second current sensing signals and providing a first signal whenever said first and second current sensing signals are equal and providing a second signal when said first and second current sensing signals are different, said second signal effectively reducing the current in said load to zero.

2. An amplifier according to claim 1, wherein said first and second sensing means comprises:

first and second sensing resistors providing first and second signals, respectively, said first and second signals being proportional to load current.

3. An amplifier according to claim 1 wherein said comparator means comprises:

an amplifier having a first threshold in response to like first and second signals and providing said first output signal, and having a second threshold in response to different first and second signals and providing said second output signal.

4. An amplifier according to claim 3 wherein said amplifier comprises:

an operational amplifier.

5. A power amplifier having current sensing and limiting protection, comprising:

signal input means;

voltage supply means having a predetermined voltage;

first amplifier means coupled to said signal input means for establishing a reference potential for a load at one half of said supply voltage;

first power amplifier means coupled to said amplifier means;

first sensing means coupled to first power amplifier means, said first sensing means for providing first and second control signals;

first means coupling said load to said first sensing means;

second amplifier means for receiving said first and second control signals coupled to said first amplifier means for controlling the current in said first sensing means;

inverter means for providing a signal inverted from said first control signal, said inverter means being biased to have a signal being one half of said supply voltage;

second power amplifier means coupled to said inverter means;

second sensing means coupled to said second power amplifier means, said second sensing means for providing third and fourth control signals;

second means coupling said load to said second sensing means;

comparator means responsive to first, second, third and fourth control signals, said comparator means coupled to said first amplifier means and to said inverter means, said comparator means for providing a first output signal in response to the differential of said first and second control signals and the differential of said third and fourth control signals being alike, and for providing a second output signal in response to said differentials being different, said second output signal inactivating said first and second power amplifier means.

6. A power amplifier according to claim 5, wherein said first and second sensing means comprise:

first and second current sensing resistors, respectively, and said first resistor providing first and second control signals being a first differential voltage, said second resistor providing third and fourth control signals being a second differential voltage.

* * * * *